Dec. 23, 1958
D. J. TREVOY
2,865,750
PHOTOMECHANICAL REPRODUCTION
Filed March 18, 1955
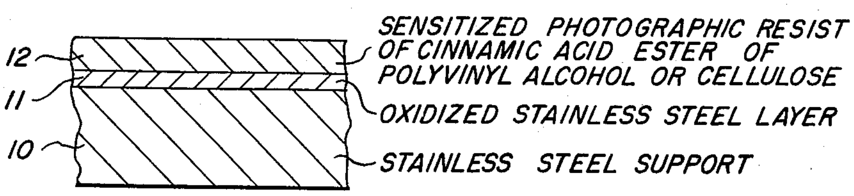
DONALD J. TREVOY
INVENTOR.
BY Daniel I. Mayne
Walter O. Hodsdon
ATTORNEYS United States Patent Office 2,865,750
Patented Dec. 23, 1958

2,865,750

PHOTOMECHANICAL REPRODUCTION

Donald J. Trevoy, Rochester, N. Y., assignor to Eastman Kodak Company, Rochester, N. Y., a corporation of New Jersey Application March 18, 1955, Serial No. 495,343

5 Claims. (Cl. 96—86)

This invention relates to photomechanical reproduction, and more particularly to a method of improving the adhesion of a photographic resist to stainless steel. This invention also relates to a photographic element comprising an oxidized stainless steel base with an adherent photographic resist thereon; and to improved methods of etching the stainless steel base in areas unprotected by the exposed and hardened resist without lessening the adhesion of the resist to the oxidized stainless steel.

Heretofore, when employing these more common types of photographic resists on a metal base such as a sheet of copper or zinc, it is customary to degrease the metal surface, coat the resist thereon as in a whirler, expose the resist through a suitable contact screen, or to line or halftone subjects, develop the plate in water or alcohol to remove the resist only in the unexposed area, bake the image and etch the underlying unprotected metal in an etching solution of ferric chloride or nitric acid.

More recently new types of photomechanical resist compositions have been invented comprising light sensitive polymeric materials such as cinnamic acid esters of polyvinyl alcohol and which have been further sensitized by the incorporation of certain light sensitizing agents. These new photographic resists are described in Minsk et al. Patents 2,610,120 of Sept. 9, 1952, as well as in Patents 2,670,285; 2,670,286 and 2,670,287 of Feb. 23, 1954. The copending U. S. patent application by Earl M. Robertson, Ser. No. 314,806, filed Oct. 15, 1952, now Patent 2,732,301 of January 24, 1956, also discloses important modifications of these sensitized polyvinyl cinnamate photographic resist compositions.

Such polyvinyl cinnamate resist compositions also adhere well to copper and zinc bases. However, when for certain purposes it appeared desirable to employ these polyvinyl cinnamate resists on bases of stainless steel, difficulty was experienced in placing a uniform coating of the resist on the stainless steel surface.

Furthermore, the adhesion of the resist to stainless steel is rather poor and the resist often strips off the stainless steel during the development of the exposed image, or during the subsequent etching of the stainless steel surface. Etching of the relatively unreactive stainless steel alloy in ferric chloride is very slow, and, while the addition of nitric or hydrochloric acid to the ferric chloride solution accelerates the rate of etching, the presence of these acids increases the tendency of the resist to separate from the stainless steel surface.

An object therefore of the present invention is to provide a photographic element comprising an adherent polyvinyl cinnamate photographic resist on a stainless steel support.

Another object of the invention is to provide a photographic element comprising a polyvinyl cinnamate photographic resist which is tenaciously attached to an oxidized stainless steel support.

Still another object of this invention is to provide an etching solution which will rapidly etch the stainless steel support of such a photographic element without lessening the adhesion of the resist to the support.

Another object of this invention is to provide a rapid electrolytic method of etching such a photographic resist element which will not lessen the adhesion of the resist to the stainless steel support.

Still another object is to provide an efficient method of preparing stainless steel printing plates, name plates, etc. as well as placing identifying indicia on stainless steel machine parts, or the like.

Other objects will appear hereinafter.

In accordance with one feature of my invention, I have found that photographic resist elements can be effectively made when employing a stainless steel base, such as a stainless steel sheet, by first oxidizing the stainless steel in air at a temperature of from 500–950° C. for 2 to 3 minutes. A uniform brown or blue oxide film is thus produced on the stainless steel.

This oxide surface, as contrasted with an unoxidized stainless steel surface, has improved water receptivity and the photographic resist is more easily and effectively coated thereon by the usual methods for example by employing a horizontal whirler. Alternatively in place of aerial oxidation, the stainless steel sheet may be etched in aqueous acid such as aqueous hydrochloric acid, or can be anodically etched in an electrolyte such as sodium nitrate, using a direct current, or can be etched in ferric chloride with or without employing an electric current.

The photographic resist coating when dry may be exposed through a suitable negative or positive to a carbon arc to form a desired exposed and non-exposed pattern or image on the photographic resist. The unexposed portion of the resist may then be removed from the oxidized stainless steel plate by development in a suitable solution, and the developed image which remains attached to the oxidized plate is baked.

To prepare relief images on the stainless steel plate, this baked image on the oxidized or etched stainless steel plate is transferred to an electrolytic bath which preferably contains an aqueous ferric chloride solution, 42° Bé. in which, in accordance with another important feature of my invention, sodium nitrate in an amount of 7% by weight of the ferric chloride is dissolved. The stainless steel plate having the baked image thereon is then made the anode in this ferric chloride-sodium nitrate solution and a current is applied between it and a metal cathode. Etching is done electrolytically using 5–20 volts and 1–5 amperes per square inch of gross plate area. Preferably the electrolyte is maintained at a temperature of 20–60° C. during the etching process. The resist is then removed from the processed plate and it is then rinsed in water and dried.

The following examples illustrate the manner of preparing an etched image on stainless steel using a resist made in accordance with the methods described above.

*Example 1*

A 2" x 5" plate of cold rolled stainless steel (17–7% chromium-nickel) was thoroughly scrubbed with a pumice cleaner and water and then rinsed thoroughly in running water and dried. The stainless steel was then oxidized in an electric furnace at a temperature of 500–950° C. for five minutes. The surface of the stainless steel assumed a tan color indicating sufficient oxidation. The stainless steel was cooled to room temperature.

The selected sensitized polyvinyl cinnamate photographic resist which may be for example polyvinyl cinnamate sensitized with 6-nitrobenzothiazole is now coated on the oxidized surface of the stainless steel employing a horizontal whirler rotating at 80 to 100 R. P. M. until dry. The drying time can be shortened to 3 to 5 minutes by whirling the resist coated stainless steel plate over enclosed electric strip heaters or infrared lamps.

The dry resist coated plate is then exposed through a suitable negative or positive. A typical exposure is four minutes with a 35-ampere carbon arc lamp at a distance of three feet. It is desirable to employ a No. 2 step tablet as an aid in determining exposure in relation to other tops. The exposed resist coated stainless steel plate is then immersed in a tank or tray of resist developer at room temperature for a minimum of two minutes. Intermittent agitation of the developer may be employed. The image will not be overdeveloped even after 24 hours in the developer.

After at least two minutes development the image on the stainless steel plate is dyed in a suitable dye for 30 seconds. The resist coated plate is then washed for one minute under a strong stream of running warm water (65° F. or warmer) to remove the excess dye and the unexposed resist. At this point, the black-dyed resist image becomes fully visible. The plate is dried to prevent water spots by blotting or blowing away excess water droplets, and then further dried by the mild application of heated air.

The resist image on the plate is now baked in an electric oven at 175–275° C. for five minutes or until the black dyed image turns slightly brownish. If the plate has not been overheated the image will revert to its original color on cooling. Overheating causes a permanent brown color, poor adhesion and inferior etching resistance.

The resists described in the above-mentioned patents and application may be processed as above described and may be generally employed with various etching solutions, except when the resists are coated on stainless steel. Solutions containing aqua regia generally cause the resist to strip off the surface before etching is completed. Also conventional ferric chloride etches which act very slowly often cause stripping of the resist from the oxidized stainless steel surfaces.

Preferably the etching is done electrolytically and the baked image on the oxidized or etched stainless steel plate is transferred to an electrolytic bath containing 42° Bé. aqueous ferric chloride solution and sodium nitrate in an amount of 7% by weight of the ferric chloride. The image bearing plate is made the anode in this aqueous ferric chloride-sodium nitrate solution and a current is applied between it and a metal cathode. Etching is done by electrolysis using 5 to 20 volts and 1 to 5 amperes per square inch of gross plate area. The temperature of the electrolyte may be advantageously maintained at 20 to 60° C. during etching.

I have found that if the stainless steel plate is oxidized, as described above, before being coated with the selected polyvinyl cinnamate photographic resist and if the etching is done in the ferric chloride solution containing the specified amount of sodium nitrate that no difficulty due to stripping of the resist from the plate occurs.

If desired, the etching solution employed in the above examples can be agitated, or conversely, the sheet being processed can be moved in the etching solution. Also the stainless steel sheet can be coated by pouring the resist onto the sheet in a vertical position, or when the sheet is in an inclined plane. The stainless steel sheet may also be oxidized or etched and coated on both sides with the resist, exposed in register and anodically etched from both sides simultaneously using two cathodes.

Very rapid dissolution of the unprotected areas of the oxidized stainless steel plate is effected when making the plate the anode with a parallel stainless steel cathode at a distance of 1–3 cm. and applying a direct current. In one operation the current was about 2 amps per square inch of gross plate area at 10–15 volts and dissolution of a sheet 0.005 inch thick occurred in about 4 minutes, when etched from one side. Without the current, and with or without agitation of the electrolyte, etching for this depth was not realized even after several hours.

Where speed, economy and reliability of development is desired, the use of a trichloroethylene vapor degreaser apparatus to develop the exposed plate is recommended. Development time in these machines requires only about 30 seconds and the plate comes out ready for dyeing or etching. Although the processed resist image is only slightly visible at this stage without dyeing, it nevertheless can be etched satisfactorily.

Vapor degreaser machines have been in common use for some time in machine shops where they are used to clean castings and other metal parts prior to finishing. They are also used extensively in electroplating plants to obtain the cleanest possible plating surface. Basically, the vapor degreaser consists of a stainless or zinc-coated steel tank which has a sump or well. This sump is heated either by gas, electric heaters, or steam coils, and holds a supply of solvent, for example, trichloroethylene solvent. The solvent in the sump boils at about 190° F. causing hot, clean, solvent vapor to fill the main chamber of the tank above the sump. A cooling water jacket around the top of the chamber condenses the vapor as it rises in the tank and returns it to a storage tank. When the condensate has filled the storage tank, the excess overflows back to the heated sump to repeat the cycle. The clean, condensed solvent in the storage tank also may be pumped through a recirculating line to a slush removing spray-nozzle inside the vapor chamber. Here it is recovered in the sump after being used to spray the work that is being degreased. While the vapor satisfactorily removes oil and greases, the spray provides sufficient mechanical force to flush solid material from the work surface. Such degreasing units are described as "vapor-slush degreasers" or "vapor-spray-vapor-degreasers" and are available on the market.

The advantage of the vapor degreaser lies in the fact that it is a self-contained unit charged with solvent that can be recycled indefinitely. Work is always processed in freshly distilled solvent and pure hot vapor. All contamination is confined to the sump and requires only occasional removal from the machine.

Not only can metal plates be developed in 15 to 30 seconds in a vapor degreaser, but plates can be thoroughly cleaned in the same manner, prior to coating. They can also be cleaned after etching to remove etching powder and paint.

The photo resist can be applied to the oxidized stainless steel plate by spray, dip, and roller coating techniques. Conventional coating equipment may be employed satisfactorily. A compatible lacquer may be employed to thin the photo resist for particular conditions of application.

After the etching step the resist image can be removed by scrubbing with toluol, xylol, or photo-resist developer. It can also be removed by buffing with a dry, rotary wire-bristle brush, or it can be fired-off by heating to 400–500° C. for about 15 minutes.

*Example 2*

The procedures of Example 1 were repeated employing photomechanical resist compositions comprising polyvinyl cinnamate as the combined carrier and light-sensitive material and individually sensitized with one of the following light-sensitizing agents: 6-nitrobenzothiazole, 2-methyl-6-nitrobenzothiazole, 2-methyl-x-nitronaphthothiazole, 3-methyl-2-propionyl-methylene-benzothiazoline, 3-methyl-2-benzoylmethylenebenzothiazoline, 1-ethyl-2-acetylmethylene-β-naphthothiazoline, 1-methyl-2-acetylmethylene-β-naphthothiazoline, 1-methyl-2-propionylmethylene-β-naphthothiazoline, 1-methyl-2-benzoylmethylene-β-naphthothiazoline, 1-methyl-2-m-chlorobenzoylmethylene-β-naphthothiazoline, 1-methyl-2-acetylmethylene-β-naphthoselenazoline, 2-amino-5-nitrothiazole, 2-cinnamoylmethylene-3-ethylbenzothiazoline, 2-(anilinoformyl)-methylene-1-ethyl-β-naphthothiazoline, 2-formylmethylene-1-methyl-β-naphthothiazoline 2-[2-(p-chlorophenylimino)propylidene]-1-ethyl-β-naphthothiazoline and 3,3-diethyl-4,5,4',5'-dibenzothiacyanine iodide, and no difficulty was experienced in loss of adherence to the oxidized stainless steel plate on which the resists were placed.

The preferred light-sensitive polymeric materials are obtained by esterification of hydroxy-containing polymeric materials such as cellulose or polyvinyl alcohol with a cinnamic acid halide such as cinnamic acid, o-chloro, or m-nitro cinnamic acid chlorides as described in Patent 2,670,286. Cinnamic acid esters of varying acyl content may be prepared by deacylation of substantially fully esterified cinnamic acid esters. Accordingly, the solvent-soluble esters containing from about 60 to 100 mol percent, preferably about 87 to 100 mol percent of vinyl cinnamate are used.

By the term "polyvinyl cinnamate" is meant to include only organic solvent-soluble esters of polyvinyl alcohol containing from about 60 to 100 mol percent of combined vinyl cinnamate groups, the balance being vinyl alcohol groups. Polyvinyl cinnamate of the insoluble type obtained by polymerization of vinyl cinnamate is not contemplated for use in the present invention.

By the term "cinnamic acid esters of polyvinyl alcohol and cellulose" is meant organic solvent-soluble esters containing from about 60 to 100 mol percent of combined cinnamoyl ester groups. This includes simple as well as mixed esters, e. g. polyvinyl acetate cinnamates and cellulose acetate cinnamates, containing at least 60 mol percent cinnamoyl ester and the balance comprising a different acyl group or being unesterified or both.

My novel process may be employed to prepare name plates, stainless steel grids for television tube manufacture, printing plates, placing identifying marks on small stainless steel parts and for other uses where designs and indicia are to be placed on stainless steel. My process works particularly well when using 18% Cr–8% Ni and 17% Cr–7% Ni stainless steels.

Referring to the drawing, there is shown in cross-section a representation of a photographic element according to the present invention. The stainless steel support 10 is shown having thereon an integral oxidized layer 11 onto which is coated the photographic resist layer 12. which, as described above, may be formed of a cinnamic acid ester of polyvinyl alcohol or cellulose such as polyvinyl cinnamate, polyvinyl acetate cinnamates or cellulose acetate cinnamates.

I claim:

1. The method of forming a photographic resist element having a base of stainless steel containing chromium and nickel and having thereon a photographic resist comprising a light-sensitive polymeric material consisting of a cinnamic acid ester of polyvinyl alcohol as a combined carrier and light sensitive material and containing a light sensitizing agent, which comprises oxidizing the surface of the stainless steel in air at a temperature of 500–950° C. for 2 to 3 minutes to form an oxide layer thereon, cooling the stainless steel, and coating said photographic resist thereon.

2. A photographic element comprising an oxidized stainless steel base with an adherent photographic resist thereon comprising a polymeric material consisting of a cinnamic acid ester of polyvinyl alcohol as a combined carrier and light sensitive material, said oxidized stainless steel base being formed by heating a stainless steel base in air within the range of 500–950° C. for 2 to 3 minutes.

3. A photographic element comprising an oxidized stainless steel base with an adherent photographic resist thereon comprising a polyvinyl cinnamate containing approximately 60 to 100 mol percent of vinyl cinnamate with the balance being vinyl alcohol groups, said oxidized stainless steel base being formed by heating a stainless steel base in air within the range of 500–950° C. for 2 to 3 minutes.

4. A photographic element comprising an oxidized stainless steel base with an adherent photographic resist thereon comprising a polyvinyl cinnamate containing approximately 87 to 100 mol percent of vinyl cinnamate with the balance being vinyl alcohol groups, said oxidized stainless steel base being formed by heating a stainless steel base in air within the range of 500–950° C. for 2 to 3 minutes.

5. A photographic element comprising an oxidized stainless steel base with an adherent photographic resist thereon comprising a polymeric material selected from the group consisting of cinnamic acid esters of polyvinyl alcohol and cellulose, said oxidized stainless steel base being formed by heating a stainless steel base in air within the range of 500–950° C. for 2 to 3 minutes.

References Cited in the file of this patent

UNITED STATES PATENTS

| | | |
|---|---|---|
| 2,143,995 | Meulendyke | Jan. 17, 1939 |
| 2,389,504 | Guellich | Nov. 20, 1945 |
| 2,429,107 | Petren et al. | Oct. 14, 1947 |
| 2,529,414 | Pfeffer | Nov. 7, 1950 |
| 2,659,680 | Gray | Nov. 17, 1953 |
| 2,670,287 | Minsk et al. | Feb. 23, 1954 |
| 2,714,066 | Jewett et al. | July 26, 1955 |
| 2,794,630 | Turner | June 4, 1957 |